United States Patent [19]

Behfar-Rad et al.

[11] Patent Number: 5,311,539
[45] Date of Patent: May 10, 1994

[54] ROUGHENED SIDEWALL RIDGE FOR HIGH POWER FUNDAMENTAL MODE SEMICONDUCTOR RIDGE WAVEGUIDE LASER OPERATION

[75] Inventors: Abbas Behfar-Rad, Wappingers Falls; Mark E. Jost, Fishkill, both of N.Y.; Christoph S. Harder, Zurich, Switzerland

[73] Assignee: International Business Machines Corporation, Armonk, N.Y.

[21] Appl. No.: 981,457

[22] Filed: Nov. 25, 1992

[51] Int. Cl.$^5$ .................... H01S 3/08; G02B 6/12
[52] U.S. Cl. .................... 372/96; 372/43; 372/50; 372/45; 385/131
[58] Field of Search .......... 372/43, 45, 46, 47, 372/48, 50, 96, 102, 7; 385/14, 28, 29, 131, 132

[56] References Cited

U.S. PATENT DOCUMENTS

| | | | |
|---|---|---|---|
| 4,464,762 | 8/1984 | Fuvuya | 372/50 |
| 4,622,673 | 11/1986 | Tsang | 372/45 |
| 4,792,200 | 12/1988 | Amann et al. | 382/43 X |
| 4,805,184 | 2/1989 | Fiddyment et al. | 385/131 X |
| 4,837,775 | 6/1989 | Andrews et al. | 372/96 |
| 4,845,014 | 7/1989 | Ladany | 372/96 X |
| 4,888,784 | 12/1989 | Hirata | 372/46 |
| 4,993,036 | 2/1991 | Ikeda et al. | 372/50 |
| 5,013,493 | 4/1992 | Buchmann et al. | 385/14 |
| 5,032,219 | 7/1991 | Buchmann et al. | 385/14 |
| 5,059,552 | 10/1991 | Harder et al. | 437/129 |
| 5,084,892 | 1/1992 | Hayakawa | 372/45 |
| 5,093,884 | 3/1992 | Gidon et al. | 385/132 |
| 5,132,751 | 7/1992 | Shibata et al. | 372/48 X |
| 5,179,566 | 1/1993 | Iwano et al. | 372/43 X |
| 5,182,788 | 1/1993 | Tanaka | 372/43 X |

FOREIGN PATENT DOCUMENTS 0348540  1/1990  European Pat. Off. ........ 437/129 X

OTHER PUBLICATIONS

High-Power Ridge-Wave Guide Al Ga As Grin-Sch Laser Diode, C. Harder et al Electronics Letters, Sep. 25, 1986, vol. 22, No. 20 pp. 1081-1082.

*Primary Examiner*—Brian Healy
*Attorney, Agent, or Firm*—Perman & Green

[57] ABSTRACT

A semiconductor ridge waveguide laser structure with a roughened sidewall ridge that includes a substrate and an active layer disposed between lower and upper cladding layers. The structure further includes a waveguide ridge which comprises a contact layer and a trapezoidal ridge portion 16 of the upper cladding layer. The trapezoidal ridge portion has roughened sidewalls which provides low contact resistance.

6 Claims, 4 Drawing Sheets

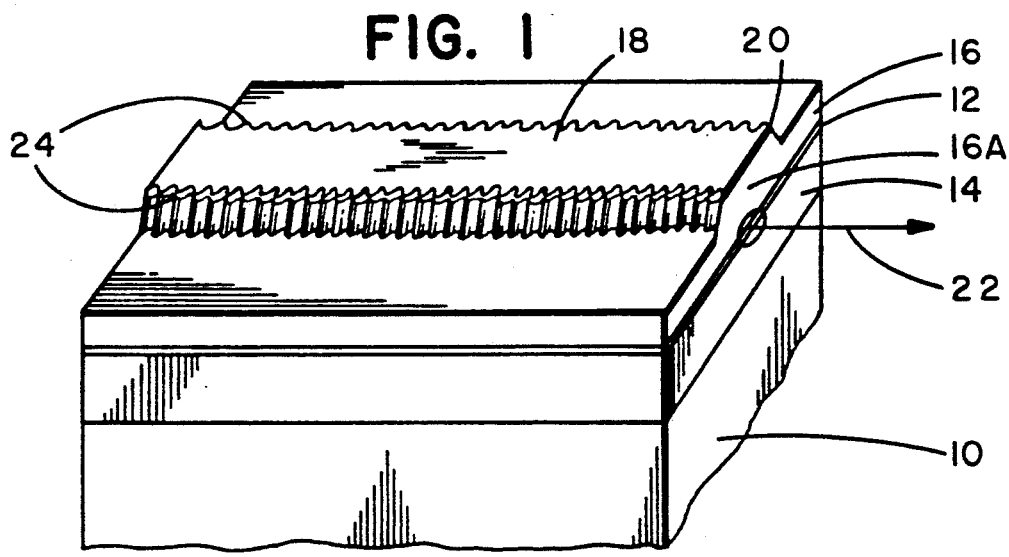
FIG. 1
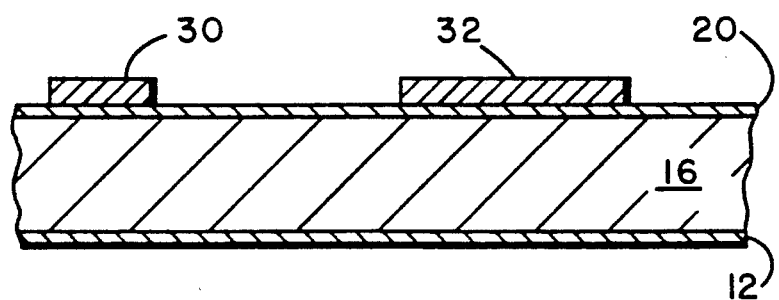
FIG. 2A
FIG. 2B
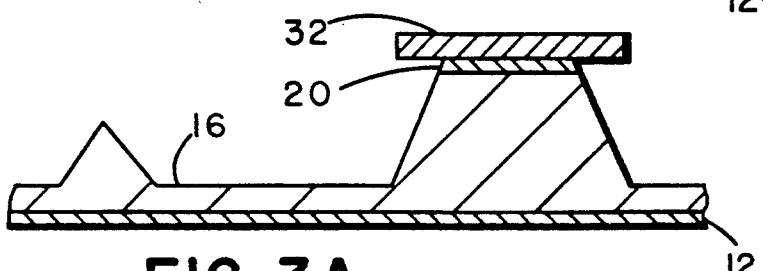
FIG. 3A
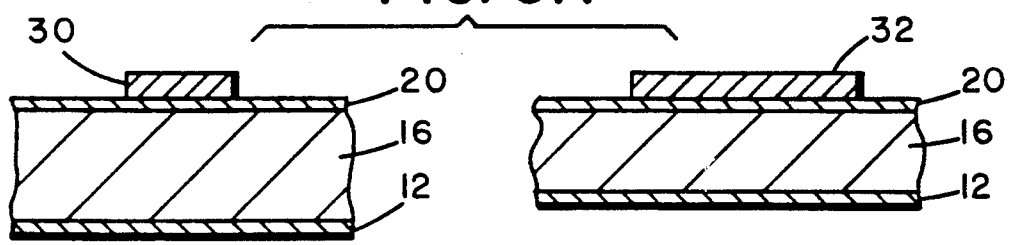
FIG. 3B
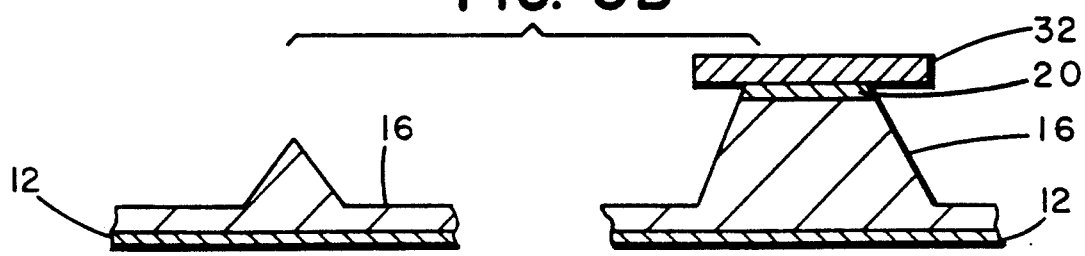

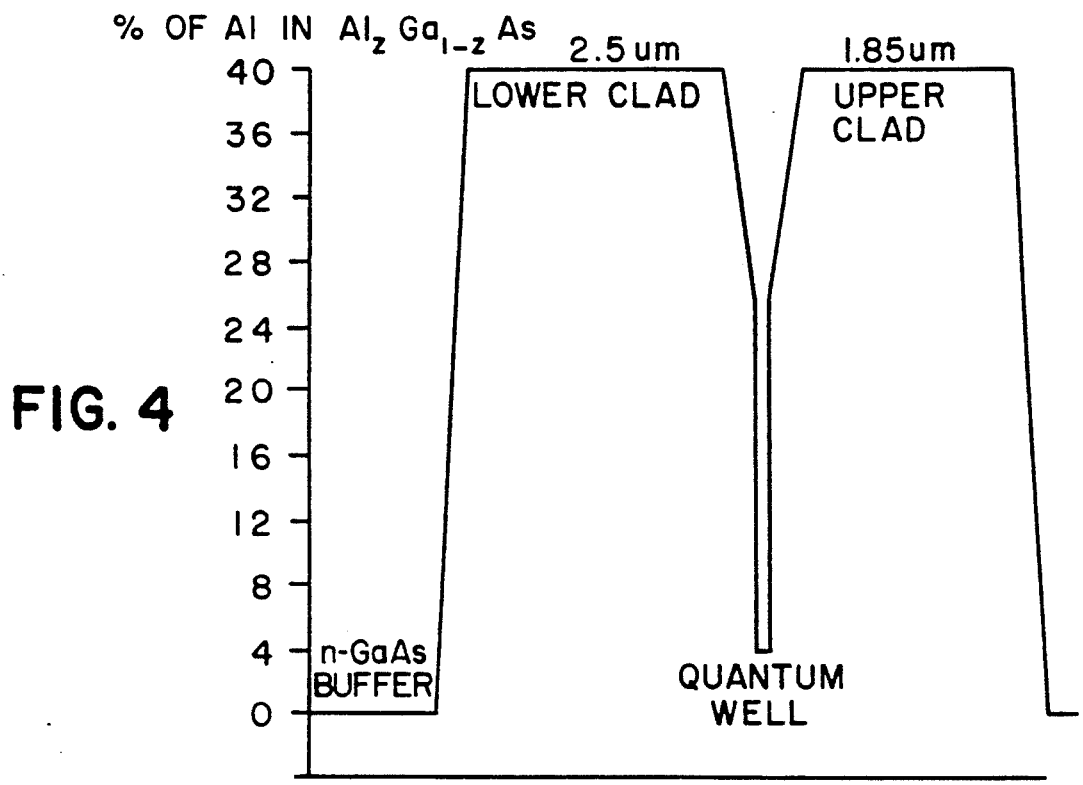
FIG. 4
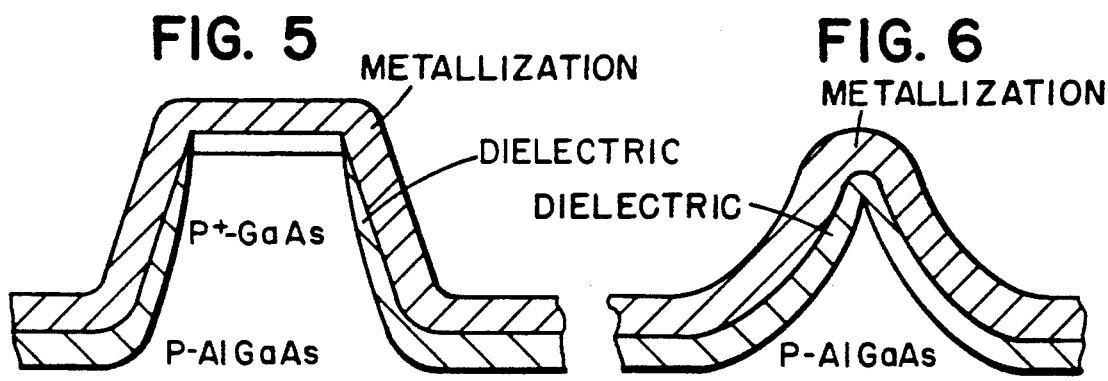
FIG. 5
FIG. 6
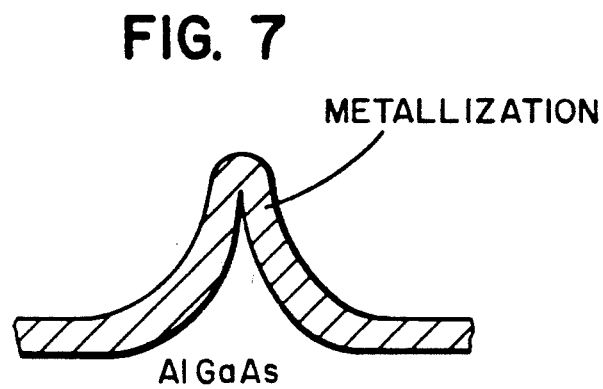
FIG. 7

ROUGHENED SIDEWALL RIDGE FOR HIGH POWER FUNDAMENTAL MODE SEMICONDUCTOR RIDGE WAVEGUIDE LASER OPERATION

FIELD OF THE INVENTION

The present invention relates to semiconductor ridge waveguide laser structures, and more particularly to the formation of the ridge portion of a ridge waveguide laser to provide high power fundamental mode operation.

BACKGROUND OF THE INVENTION

High-power semiconductor ridge waveguide lasers suffer from the excitation of higher order modes as their power output is increased. This causes their beam shape properties to vary as a function of laser output power. Such behavior causes problems in applications which use these semiconductor ridge waveguide lasers such as optical recording and optical fibers.

There are three competing requirements on ridge waveguide lasers that are formed through wet-etching of the ridge: first, the need to have good electrical contact, and second, the need to have fundamental-mode behavior and third, the need to have low waveguide absorption. A relatively small ridge width is required for high power fundamental mode operation, and to obtain a low loss waveguide there is a need for a thick upper cladding layer which in turn increases the depth to which a ridge has to be etched in order to provide good waveguiding and reduces the contact layer width which increases series resistance or removes the contact layer completely.

U.S. Pat. No. 5,059,552 issued Oct. 22, 1991 to Harder et al., entitled: PROCESS FOR FORMING THE RIDGE STRUCTURE OF A SELF-ALIGNED SEMICONDUCTOR LASER, describes a process for forming the ridge structure of a self-aligned InP-system, double heterostructure laser, particularly useful for long wavelength devices as required for signal transmission systems that includes a thin $Si_3N_4$ layer deposited at a high plasma excitation frequency for adhesion promotion, and a low frequency deposited $Si_3N_4$ layer for device embedding, provides for the etch selectively required in the process step that is used to expose the contact layer to ohmic contact metallization deposition.

The publication by C. Harder, P. Buchmann and H. Meier entitled HIGH-POWER RIDGE-WAVEGUIDE AlGaAs GRIN-SCH LASER DIODE, Electronics Letters, 25th Sep. 1986, Vol. 22, No. 20, pages 1081–1082 provides background information for semiconductor ridge waveguide laser structures and fabrication methods therefor.

SUMMARY OF INVENTION

An object of the present invention is to provide an improved semiconductor ridge waveguide laser having a high power fundamental mode and attenuated non-fundamental modes.

Another object of the present invention is to provide a semiconductor ridge waveguide laser having low contact resistance and good electrical contact.

Another object of the present invention is to provide a low loss waveguide.

A further object of the present invention is to provide a semiconductor ridge waveguide laser having low loss good fundamental and mode behavior, improved electrical contact by the incorporation of roughened ridge sidewalls.

BRIEF DESCRIPTION OF THE DRAWINGS

FIG. 1 is a schematic perspective drawing illustrating an embodiment of a semiconductor ridge waveguide laser incorporating roughened ridge sidewalls according to the principles of the present invention.

FIGS. 2A, B and FIGS. 3A, B are illustrations of portions of a semiconductor ridge waveguide structure showing problems encountered in the fabrication.

FIG. 4 is an illustration of the aluminum concentration variation in $Al_xGa_{i-x}As$ of the preferred epitaxial semiconductor laser structure, but not limited to this one structure.

FIGS. 5, 6 and 7 are schematic illustrations of examples of possible ridge cross-sections useful in the description of the present invention.

DESCRIPTION OF THE PREFERRED EMBODIMENTS

Figure 8:
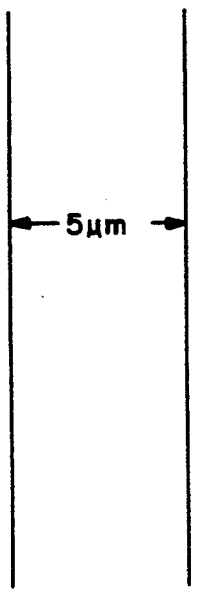
FIGS. 8 and 9 are illustrations which show the comparison of the results obtained with and without the features of the present invention. The top portion of each figure illustrates the design used for the definition of the ridges on the photolithographic mask plates.
Figure 8:
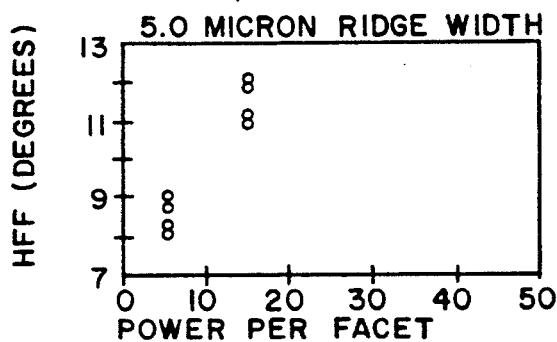

Referring to FIG. 1, a semiconductor ridge waveguide laser structure with a roughened sidewall ridge is illustrated. The structure includes a substrate 10 and an active layer 12 disposed between cladding layers 14 and 16. The structure includes the waveguide ridge 18 which comprises a contact layer 20 and a ridge portion 16A of the upper cladding layer 16. Conventional insulation for the ridge sidewalls and upper cladding layer 16 and the typical metallization layers are not shown in FIG. 1 for clarity. The ridge portion 16A is shown having roughened sidewalls which is a significant feature of the present invention.

As in any ridge waveguide laser, when the device of FIG. 1 is activated by applying proper operating voltages, a light beam 22 is emitted from the light mode region of the laser indicated by the small ellipse centering around the active region 12. In the embodiment of FIG. 1, the cladding layers 14 and 16 are composed of $Al_{0.4}Ga_{0.6}As$ and active layer 12 of a quantum well of $Al_{0.04}Ga_{0.96}As$ sandwiched between two graded regions as shown in FIG. 4. Contact layer 20 may be composed of GaAs.

The structure of FIG. 1 with the exception of the roughened sidewalls, is formed using techniques employed to fabricate prior art ridge waveguide lasers such as described in HIGH-POWER RIDGE-WAVEGUIDE AlGaAs GRIN-SCH LASER DIODE, Electronics Letters, 25 Sep. 1986, Vol. 22, No. 20, pages 1081–1082. Photolithography techniques including patterned photoresist layers to form masks, etching and epitaxial processes are employed.

A difficulty encountered with fabricating high power wet-etched single-spatial-mode GaAs/AlGaAs ridge lasers such as the type shown and described the aforementioned Electronics Letters Paper is that there are three requirements that go against each other: The first requirement is that there be low absorption in the p+-GaAs contact and metallization layers and this requires the upper cladding layer to be thick. However, in order to obtain high-power single-spatial-mode ridge lasers, the second requirement is that the ridge width has to be kept below a certain width to avoid the emergence of non-fundamental modes. The third requirement is to have good electrical contact but small ridge widths and deep etch depths due to a thick upper cladding go counter to this requirement.

The formation of a narrow ridge requires this upper cladding to be thin so as to avoid removal of the p+-GaAs contact layer. Removal of the p+-GaAs contact layer will result in the inability to form the desired ohmic contacts between the metal and the p+-GaAs layer the desired formation being shown in FIG. 5. Removal of the p+-GaAs contact layer will cause the metal to either contact the dielectric as shown in FIG. 6 or the P-AlGaAs as shown in FIG. 7, depending on the process.

These requirements combine to make it difficult for wet-etch technology to form high power lasers.

More particularly, the FIGS. 2A, 2B and 3A, 3B illustrate the aforesaid difficulties. FIG. 2A shows an active layer 12, an upper cladding layer 16 and a contact layer 20 having etch masks thereon for the step of forming the ridge region. Etch mask 30 is small width and etch mask 32 is large width. FIG. 2B illustrates the structure of FIG. 2A after etching. The problem with the small width mask 30 case is that the contact layer 20 is removed and no low resistance electrical contact is possible. The problem with the large width etch mask 32 case is that the resultant ridge width is too large to allow fundamental mode behavior at high laser outputs.

In FIG. 3A, the etch mask 30 and 32 have the same width, but a thick upper cladding layer for a low absorption waveguide is shown for mask 30 and a thin upper cladding layer for a high absorption waveguide is shown for mask 32. After etching, there is not contact layer remaining in the case of the thick upper cladding layer, and in the case of the thin upper cladding layer there is contact layer remaining but the waveguide is high absorption which leads to low efficiency and heat generation.

Figure 9:
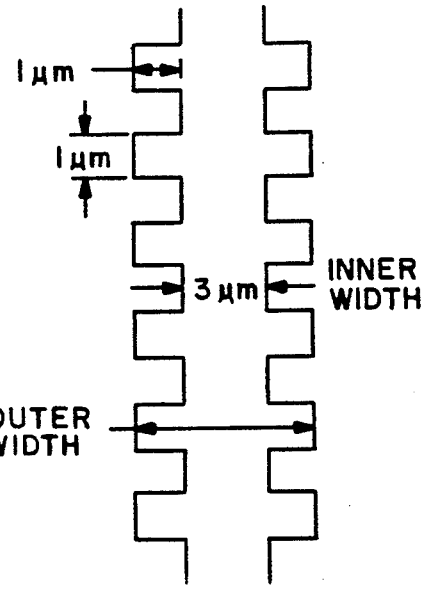
Figure 9:
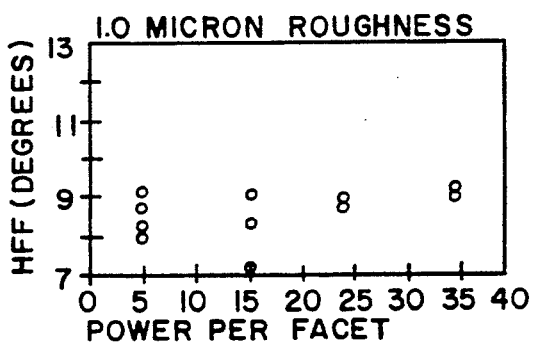

The present invention provides a solution to this problem through the use of a ridge structure that has deliberately roughened sidewalls as shown as sidewalls 24 in FIG. 1. The outer width allows a sufficient amount of p+-GaAs contact layer to remain and enable ohmic contacts and at the same time the structure of the lasers of the present invention can remain in fundamental mode operation at far higher powers than their roughness-free counterparts. FIG. 8 shows the horizontal far-field (HFF) result as a function of output power for a 3 $\mu$m inner ridge width, with the roughness parameter, a, equal to 1 $\mu$m. The control laser used for comparison is a smooth 5 $\mu$m ridge laser and the HFF results therefor as shown in FIG. 9. The dimensions given here are the dimensions on the photolithographic mask. The devices are processed at the same time and adjacent to each other. The shape shown in FIG. 9 for the roughened wall laser is what is on the photolithographic mask. The photolithographic technique used was that of proximity printing which leads to the smoothing and rounding of the rectangular pattern on the photolithographic mask. This gives the structure a sine-wave-like roughening on the sides of the ridge when viewed directly from the top. The results of FIG. 9 show the roughened ridge sidewall laser to have higher power fundamental mode operation over the smooth sidewall laser of FIG. 8. Increase in the HFF is indicative of non-fundamental modes being excited.

This technique of ridge sidewall roughening open the wet-etch technology to forming very high-power lasers. The epitaxial laser structure at FIG. 4 is grown on an n-doped GaAs substrate using molecular beam epitaxy. Proximity photolithography is performed as described earlier with a photolithographic mask to pattern photoresist. The photolithographic mask contains patterns such as those in FIG. 9. The proximity photolithography process leads to rounding of the sharp features— such as a corner of a square when the photoresist is defined. The photoresist acts as an etch mask when the sample is etched in $H_2SO_4:H_2O_2:H_2O$ (8:07:100) at room temperature. The sections not covered by photoresist are etched down to near the active region, leaving about 0.3 $\mu$m of upper cladding. The ridge has now been defined by the patterned-photoresist. Some further rounding of the sidewall roughness occurs during the etching process. About 0.2 $\mu$m of silicon nitride is deposited using Plasma Enhanced Chemical Vapor Deposition (PECVD). The silicon nitride on the photoresist is removed in solvents such as NMP with ultrasonic shaking. The top contact which are p-doped are formed through the use of photolithography and well known techniques of metallization lift-off. The metals deposited are Ti/Pt/Au in sequence and are evaporated using an electron beam evaporator. The substrate is then thinned down to a thickness of about 150 $\mu$m. The back side metal which is n-type is deposited. The metals are Ge/Au/Ni/Au in sequence.

After n contact alloy the sample is cleaved to form the facets of the semiconductor lasers. The lasers are then ready for testing.

Figure 10:
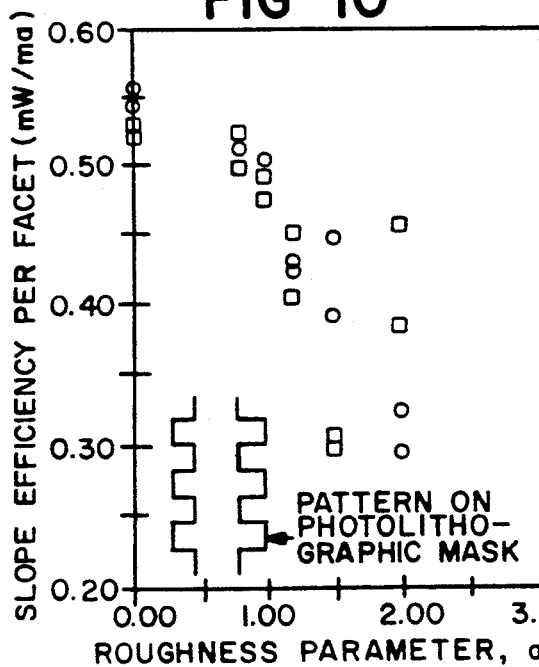
FIGS. 10 and 11 illustrate the slope efficiency of a laser as a function of the sidewall roughness, and the scatter loss due to the sidewall roughness. A 5 $\mu m$ (micrometer) ridge width without roughness is used at a=0. The insert to FIG. 10 shows the pattern of the photolithography mask.

Ridge sidewall roughness results in scattering losses. In lasers with ridge sidewall roughness, the scattering loss for higher order modes is much larger than the fundamental mode and this is why the lasers tend to operate in fundamental mode even at high output powers. The slope efficiency (SE) of semiconductor lasers is very sensitive to scattering losses in the waveguide. FIG. 10 shows the results for the SE as a function of the roughness parameter, a. At a=0 $\mu$m, the result for a 5 $\mu$m ridge of no roughness is used, while for all other a's, the inner ridge width is kept constant at 3 $\mu$m and roughness added as shown in the insert of FIG. 10. The results show a drop of SE with increase in a.

Figure 11:
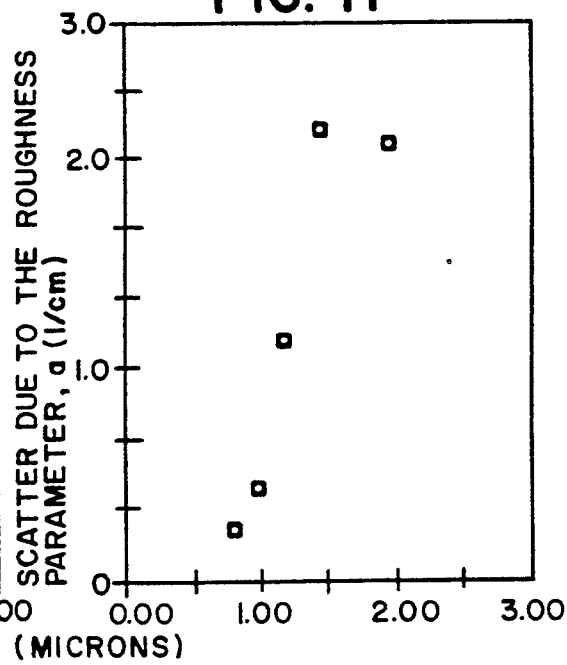

Using the average results (for every value of a) from FIG. 10, the scatter loss in the waveguide solely due to this deliberate roughness has been calculated and is shown in FIG. 11. This shows the scatter loss to increase with a. Since the laser fundamental mode operation is maintained to relatively high powers even with the small (a=0.8 $\mu$m) roughness, use of small value of a is the most desirable. This allows a small scatter loss to the fundamental mode, while non-fundamental modes still have sufficiently high scatter loss to prevent them from lasing.

Although proximity photolithography was employed in the above experiment, projection photolithography or contact photolithography could be used also. Furthermore, direct write of a roughening pattern could be performed using electron-beam lithography. In general, any tool capable of lithography can be a candidate for the deposition of the etch mask that allows the formation of the roughened-ridge-sidewall laser.

Random (non-deliberate) roughness due to processing or mask erosion (in contact lithography) has given rise to better fundamental mode operation in both wet and dry-etched ridge lasers over that of lasers with smooth ridge sidewalls. This is in agreement with the current result. Dry-etched ridge technology can form a narrow ridge even with thick top cladding layer, however, it still benefits from this technique for high power fundamental mode operation.

Figure 12:
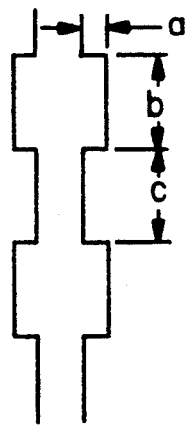
FIGS. 12, 13 and 14 are schematic cross-section illustrations which show three different designs employed in the present invention.
Figure 13:
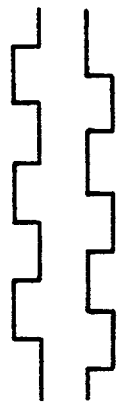
Figure 14:
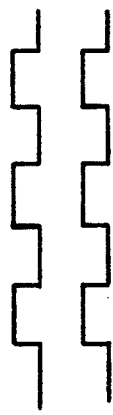

Variations to the roughness design is shown in FIGS. 12, 13 and 14. These different designs can be preferable in different situations. For example, FIG. 11 shows a design that maintains the contact area constant along the length of the ridge.

What has been described is an improved semiconductor ridge waveguide laser structure wherein deliberate and controlled roughening of the ridge sidewalls provide high power fundamental mode operation in wet-etched ridge lasers. The technique of the present invention is applicable to both dry and wet ridge etch technologies.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

We claim:

1. A semiconductor ridge waveguide structure comprising:
   a semiconductor substrate;
   a first cladding layer disposed on said substrate;
   an active layer disposed on said first cladding layer
   a second cladding layer disposed on said active layer, said second cladding layer including a raised ridge section extending on said second cladding layer, said ridge section having a trapezoidal cross-section with sloping sides 5 micrometers or less distance apart that have a roughened surface to prevent non-fundamental Fabry-Perot modes from occurring;
   and a contact layer disposed on said ridge section.

2. A semiconductor ridge waveguide structure according to claim 1 wherein said roughened sides of said ridge section form a corrugated surface of peaks and furrows.

3. A semiconductor ridge waveguide structure according to claim 2 wherein said peaks and furrows in said sides of said ridge section extend from the top of said ridge sides to the bottom of said ridge sides, wherein said peaks are approximately one micrometer or less high and wherein the said 5 micrometers or less width of said ridge piece periodically varies in thickness by approximately two micrometers or less.

4. A semiconductor ridge waveguide laser structure according to claim 3 wherein the larger ridge width between said peaks of said sidewalls enables low resistance ohmic contacts to be provided, and the smaller width of said ridge portion between said furrows enables relatively high power fundamental Fabry-Perot mode operation and prevents non-fundamental Fabry-Perot modes from occurring.

5. A semiconductor ridge waveguide laser structure according to claim 4 wherein said substrate is composed of GaAs, said first and second buffer layers are composed of AlGaAs, said active region is composed of a quantum well sandwiched by graded regions of AlGaAs and said contact layer is composed of GaAs.

6. A semiconductor ridge waveguide laser structure according to claim 4 wherein said peaks and furrows of said sides of said ridge section are formed by proximity printing a pattern of ridges and furrows on said sides by a photolithographic mask and etching through said mask.

* * * * *